United States Patent [19]
Kirihata et al.

[11] Patent Number: 5,499,211
[45] Date of Patent: Mar. 12, 1996

[54] BIT-LINE PRECHARGE CURRENT LIMITER FOR CMOS DYNAMIC MEMORIES

[75] Inventors: Toshiaki Kirihata, Wappingers Falls; Shuso Fujii, Hopewell Junction; Yohji Watanabe, Fishkill, all of N.Y.

[73] Assignees: International Business Machines Corporation, Armonk, N.Y.; Kabushiki Kaisha Toshiba, Japan

[21] Appl. No.: 402,442

[22] Filed: Mar. 13, 1995

[51] Int. Cl.$^6$ ................................. G11C 13/00
[52] U.S. Cl. ................ 365/203; 365/190; 365/202
[58] Field of Search .................... 365/202, 203, 365/190, 156, 181

[56] References Cited

U.S. PATENT DOCUMENTS

| | | |
|---|---|---|
| 4,636,983 | 1/1987 | Young et al. ........................ 365/181 |
| 4,730,276 | 3/1988 | Waller ................................ 365/189 |
| 4,998,223 | 3/1991 | Akaogi ........................... 365/230.03 |
| 5,012,132 | 4/1991 | Wang .............................. 307/296.1 |
| 5,255,235 | 10/1993 | Miyatake ....................... 365/149 X |
| 5,270,971 | 12/1993 | Muraoka et al. ................ 365/189.01 |
| 5,280,451 | 1/1994 | Akaogi .............................. 365/200 |

Primary Examiner—Do Hyun Yoo
Attorney, Agent, or Firm—Whitham, Curtis, Whitham & McGinn; Charles W. Peterson

[57] ABSTRACT

A fault-tolerant DRAM design minimizes current flow in the even of a cross-fail. A bit-line precharge current limiter is provided for the bit-line precharge equalizer circuit. The bit-line precharge current limiter is both simple and effective, requiring very little silicon area to implement. The current limiter provides self current-limiting for defective bit-lines, without the necessity for a reference cell.

8 Claims, 6 Drawing Sheets

BIT-LINE PRECHARGE CURRENT LIMITER FOR CMOS DYNAMIC MEMORIES

BACKGROUND OF THE INVENTION

1. Field of the Invention

The present invention generally relates to low power dynamic random access memories (DRAMs) and, more particularly, to an improved fault-tolerant design for a DRAM.

2. Background Description

There is a strong demand for low power DRAMs, especially with a low standby current. One design concern of the low power DRAMs is a word-line and bit-line short. Conventional redundancy architecture employs a repair region in each block. This architecture has several disadvantages. First, each block must have at least one, and preferably two, redundant row and column, increasing design space. Second, grouped or clustered fails are difficult to repair. Third, a cross fail (i.e., a word-line, bit-line short-circuit) increases the standby current, causing a standby failure. One approach to minimizing current flow in the even of a cross fail is the use of a pulsed equalizer control while enabling the precharge equalizer signal. This scheme, however allows a floating state in each bit-line pair, causing a bit-line voltage drift in a long pause condition. To avoid this problem, a reference cell is provided for bit-line sensing. Such a reference cell, however, requires a complicated layout, difficult control and a large active current dissipation.

SUMMARY OF THE INVENTION

It is therefore an object of the invention to provide a low power DRAM with an improved fault-tolerant design.

It is another object of the invention to provide a fault-tolerant DRAM which minimizes current flow in the even of a cross fail.

According to the invention, a bit-line precharge current limiter is provided for the bit-line precharge equalizer circuit. The bit-line precharge current limiter is both simple and effective, requiring very little silicon area to implement. The current limiter provides self current-limiting for defective bit-lines, without the necessity for a reference cell.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
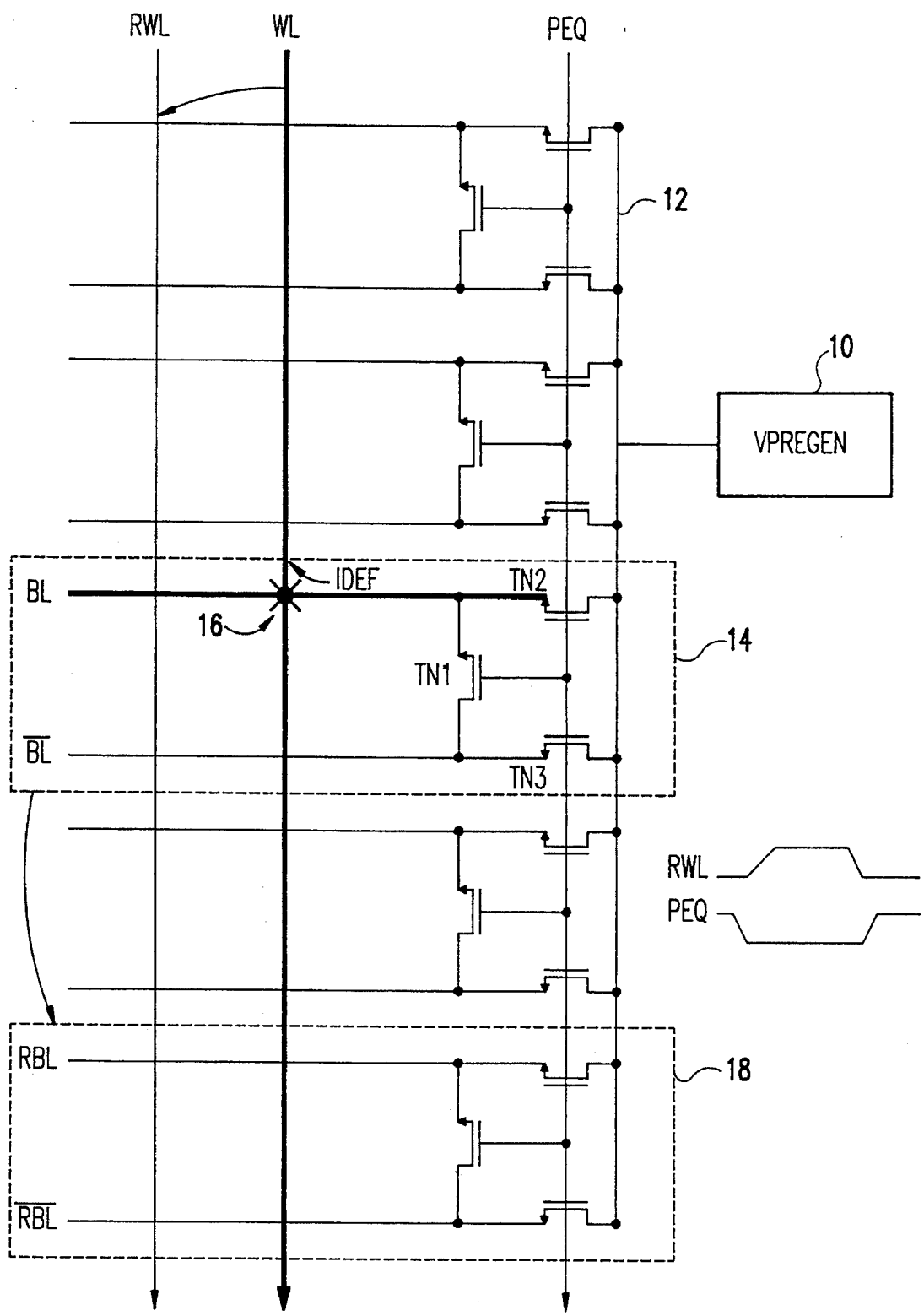
FIG. 1 is a schematic diagram of a conventional bit-line precharge scheme illustrating a word-line, bit-line short-circuit.

Referring now to the drawings, and more particularly to FIG. 1, there is shown a conventional bit-line precharge circuit. A source 10 of precharge voltage, VPREGEN, is connected to a bus 12 which supplies precharge voltage to each of the bit-line precharge equalization circuits. A typical bit-line precharge equalization circuit with the bit-line pair is denoted by the dotted line box 14 and comprises three N-type metal oxide semiconductor (MOS) field effect transistors (FETs) TN1, TN2 and TN3. The drains of FETs TN2 and TN3 are connected in common to the precharge bus 12, while their sources are connected to complementary bit-lines BL and $\overline{BL}$, respectively. The source of FET TN1 is connected to bit-line BL, while its drain is connected to complementary bit-line $\overline{BL}$. The gates of each of FETs TN1, TN2 and TN3 are connected to precharge equalization line, PEQ.

One design concern in low power DRAMs is a word-line and bit-line short, shown generally at 16 by the "X" at the intersection of the word-line, WL, and the bit-line, BL. In general, a chip with a short is fixed by using a redundancy word-line, RWL, and redundancy bitline, RBL. In the event of a cross fail, a redundant precharge equalization circuit as shown in the dotted box 18 in FIG. 1 is used. The chip, however, still allows current (IDEF) flow from the precharge generator 10 (VPREGEN) to the defective word-line (WL) through the bit-line equalizer (FETs TN 1-3), resulting in a high standby current.

Figure 2:
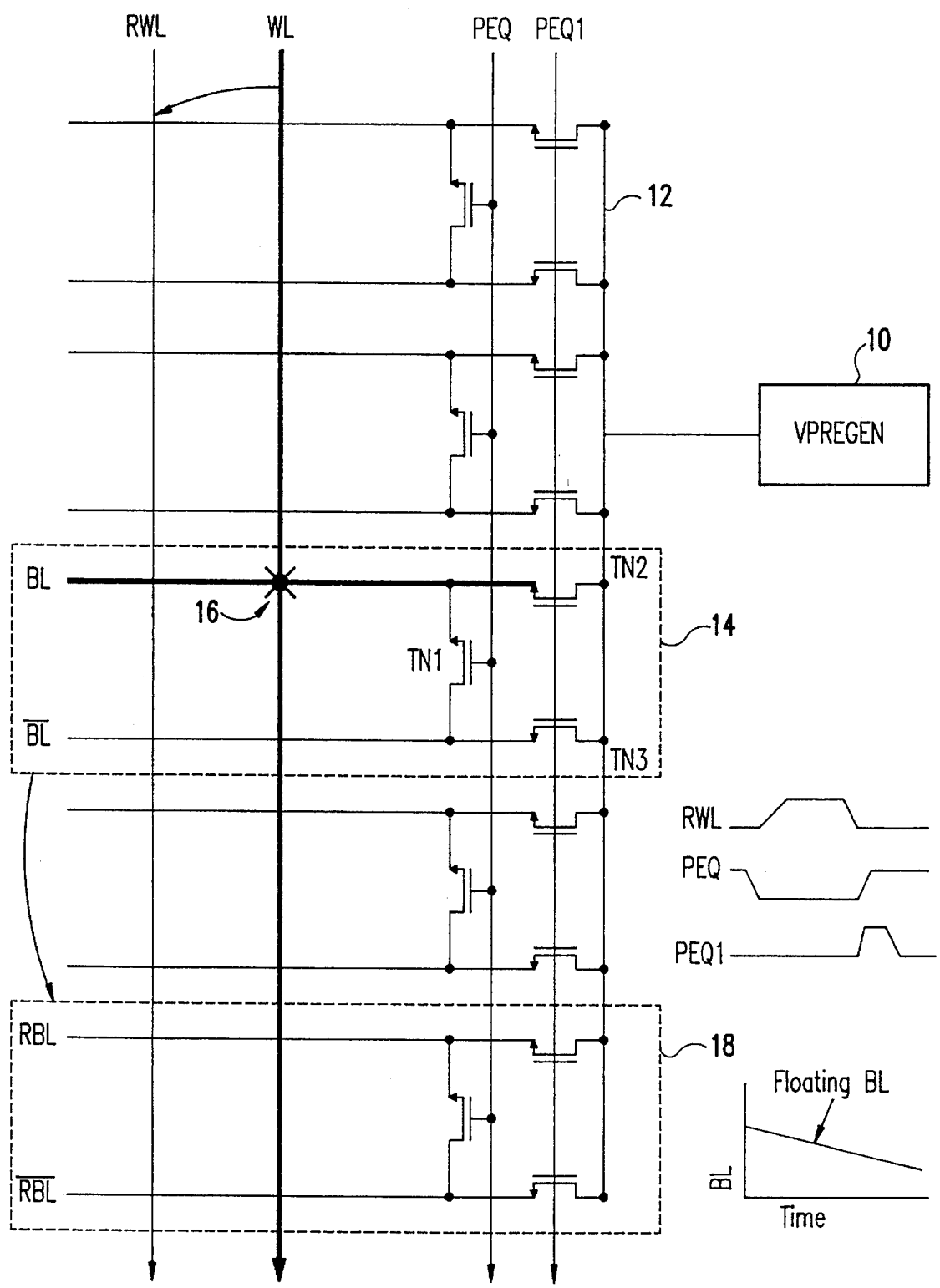
FIG. 2 is a schematic diagram of another conventional bit-line precharge scheme.

An alternative bit-line equalizer circuit shown in FIG. 2 can eliminate the current flow by using a pulsed precharge equalizing control PEQ1 applied to the gates of FETs TN2 and TN3, while enabling the precharge equalization signal PEQ. This scheme, however, allows a floating state in each bit-line pair, causing a bit-line voltage drift in a long pause condition. In order to marginally sense the bit even in a long pause condition, a reference cell must be used for bit-line sensing in this scheme. However, such a reference cell requires a complicated layout, difficult control, and large active current dissipation.

Thus, the existing schemes as illustrated in FIGS. 1 and 2 contain disadvantages with regard to current flowing into a short-circuit and the need for a reference cell, respectively.

Figure 3:
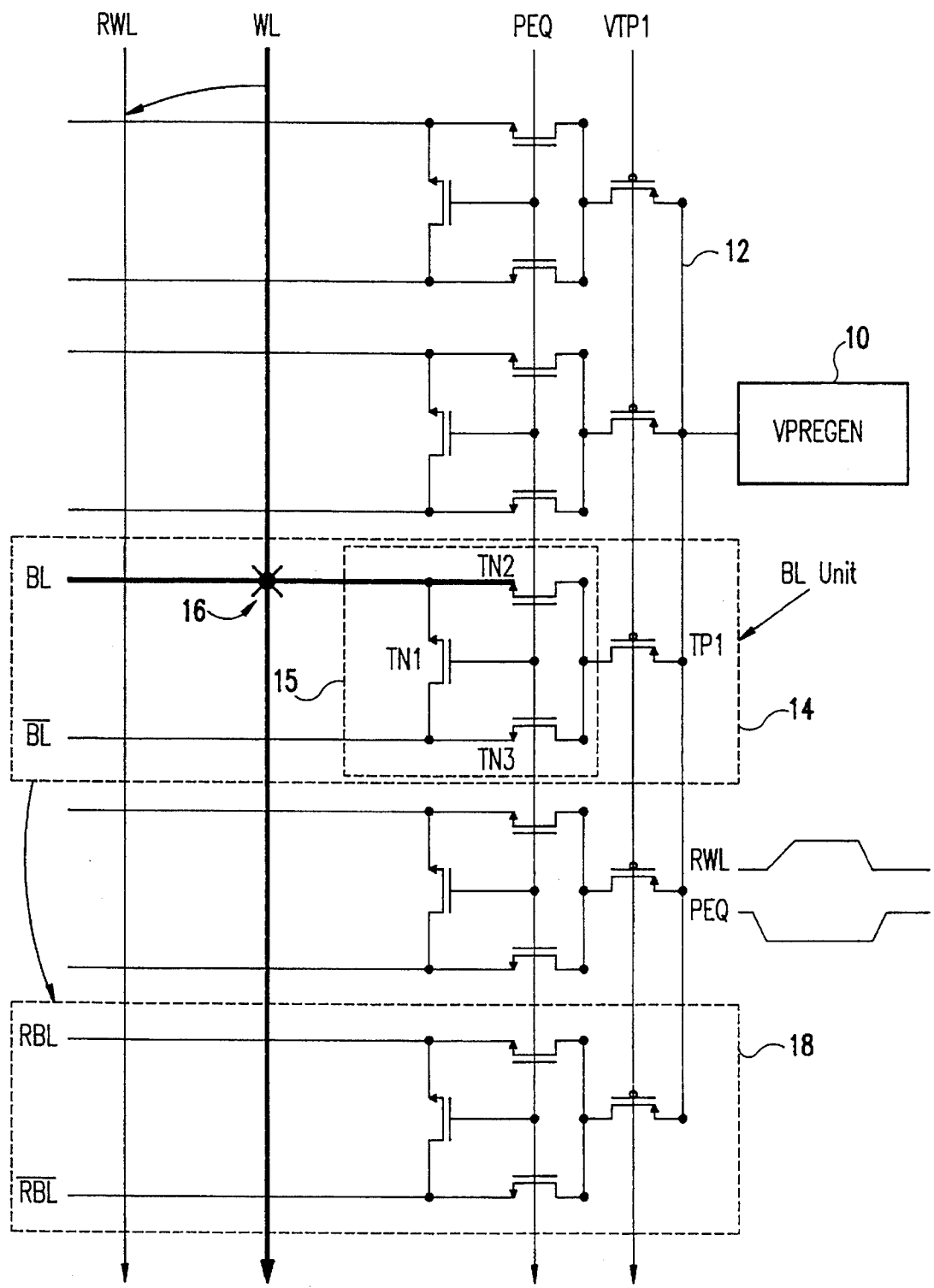
FIG. 3 is a schematic diagram of a PMOS bit-line precharge current limiter circuit according to a first embodiment of the present invention.

FIG. 3 illustrates a first embodiment of the present invention. In this embodiment, a PMOS FET device TP1 is implemented between VPREGEN 10 and the conventional bit-line equalizer 15 comprising FETs TN1 to TN3. One PMOS FET TP1 is provided on each bit-line unit, which can be replaced with a redundant bit-line unit. In other words, TP1 can be shared for more than one bit-line precharge equalization circuit. VPREGEN 10 is shared for every bit-line. Direct current voltage VTP1 is provided for the TP1 gate. The voltage VTP1 is set at an ideal voltage to allow a sufficient but not excess precharge current of IPRE limited by the TP1 device. In general, the normal bit-line current leakage, which flows to the substrate of the cell array is less than one pico ampere and, therefore, VPRE+TP1's threshold voltage is preferable, where VPRE is the bit-line precharge voltage. This allows a marginal nano ampere to maintain the non-defective bit-line voltage to VPRE. When there is a bit-line that shorts a word-line, the defective bit-line goes to ground, but the PMOS TP1 automatically limits the current flow from VPREGEN 10 to the defective bit-line, consuming no excess current.

Figure 4:
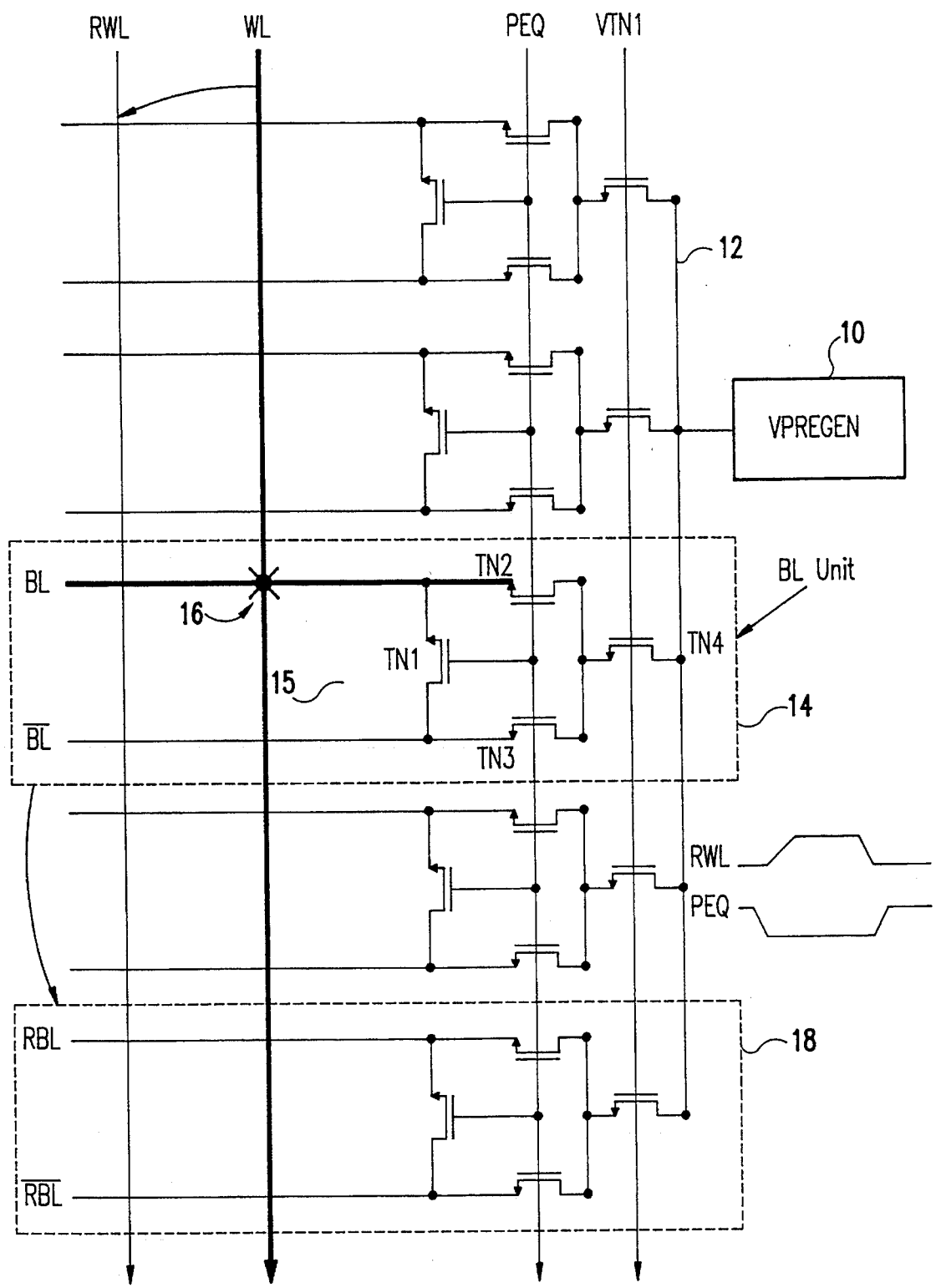
FIG. 4 is a schematic diagram of an NMOS bit-line precharge current limiter circuit according to a second embodiment of the invention.

The second embodiment of the present invention is similar to the first as shown in FIG. 4. In this embodiment, instead of a PMOS device TP1, an NMOS device TN4 is used to the same effect.

Figure 5:
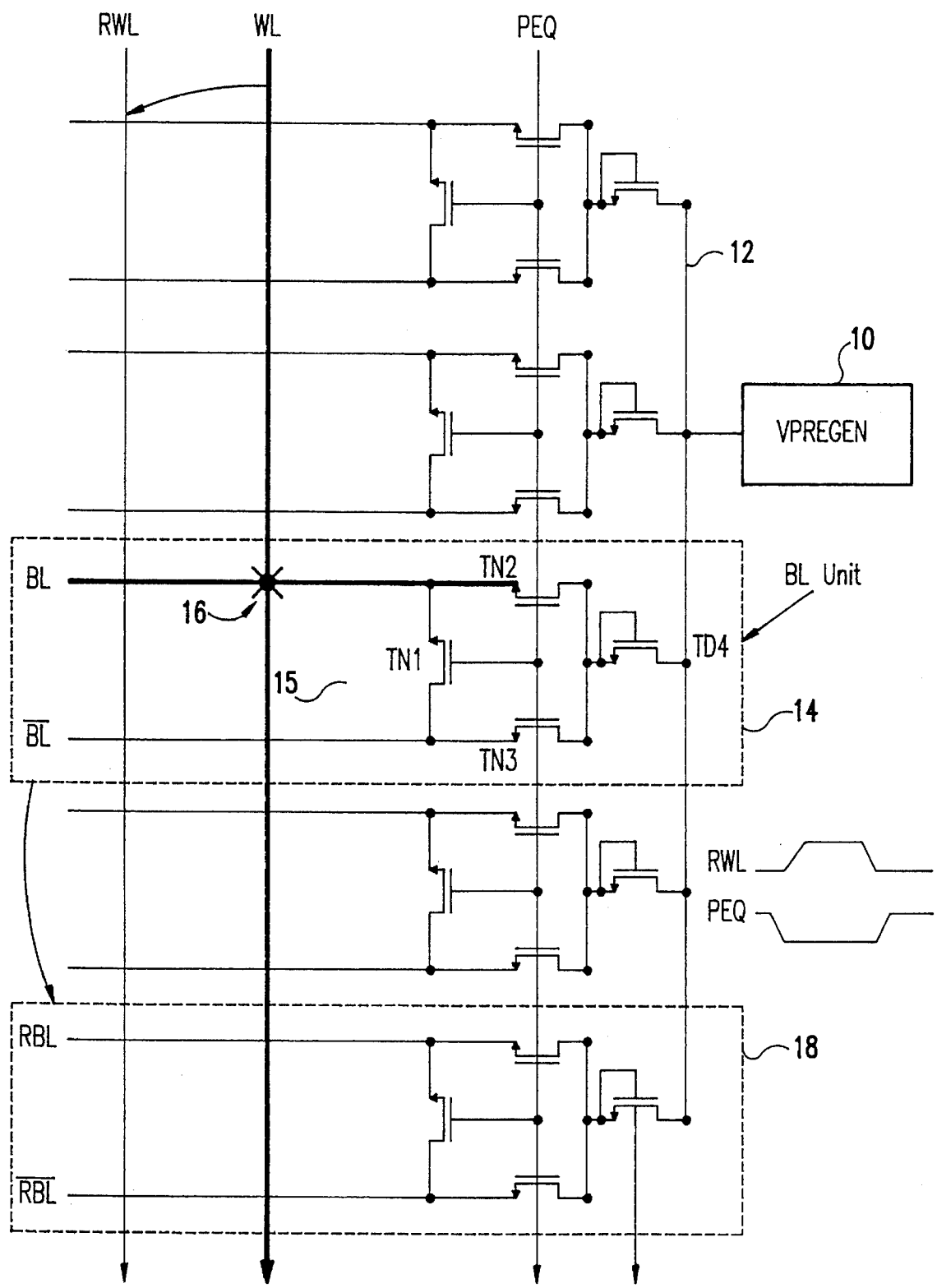
FIG. 5 is a schematic diagram of a depletion NMOS bit-line precharge limiter circuit according to a third embodiment of the invention.

The third embodiment of the invention is shown in FIG. 5. In this embodiment, a depletion NMOS device TD4 is used for current limiting. However, in this embodiment, the source and gate electrodes of the depletion NMOS device TD4 are tied together and connected to the precharge equalization circuit. The threshold voltage of the TD4 is adjusted to around −0.5V so that the transistor flows a current needed to maintain the bit-line precharge level when the gate to source voltage is 0V. In the alternative, this embodiment may be modified by substituting a resistor for the depeletion NMOS device.

Figure 6:
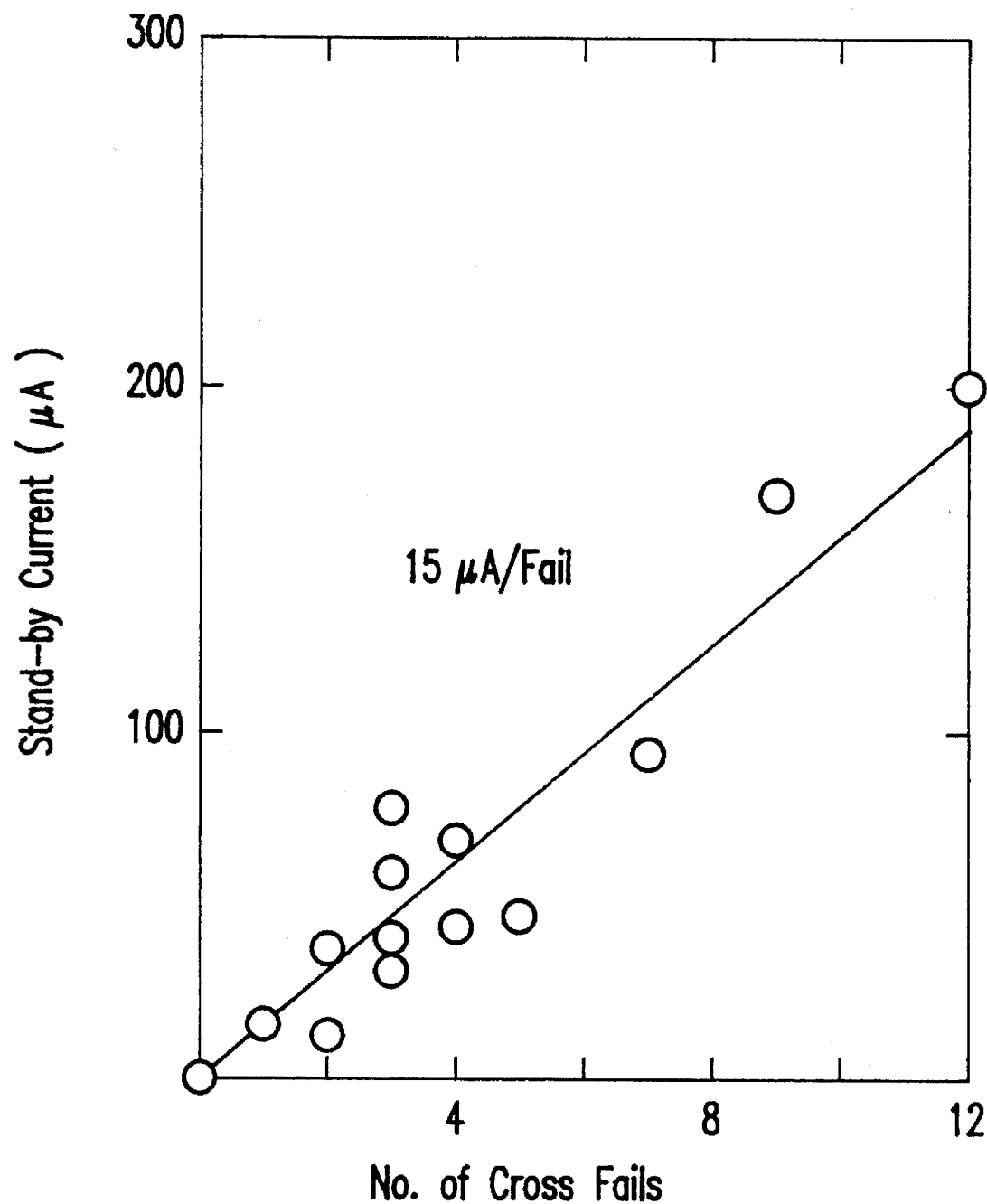
FIG. 6 is a graph showing standby current as a function of the number of cross-fails.

The fault-tolerant designs according to the invention were implemented and demonstrated with a 0.25 μm 16Mb DRAM, the array design of which is identical to the 16Mb unit of a 256Mb DRAM. The current limiter successfully reduced the current flow to only 15 μA for a cross-fail, overcoming the standby current fail, as shown in FIG. 6.

While the invention has been described in terms of three preferred embodiments, those skilled in the art will recognize that the invention can be practiced with modification within the spirit and scope of the appended claims.

Having thus described our invention, what we claim as new and desire to secure by Letters Patent is as follows:

1. A low power dynamic random access memory comprising:

a plurality of word-lines and a plurality of complementary bit-line pairs;

a source of precharge voltage for precharging said complementary bit-line pairs:

a plurality of precharge equalization circuits, each of which comprise first, second and third field effect transistors, said first field effect transistor being connected across a corresponding complementary pair of bit-lines and said second and third field effect transistors being connected in series with a respective one of said complementary pair of bit-lines, the gates of each of said first, second and third field effect transistors being connected to receive a precharge equalization control signal;

said plurality of precharge equalization circuits connected to said source of precharge voltage, one precharge equalization circuit for precharging each of said plurality of complementary bit-line pairs; and current limiting means for limiting precharge current flowing into said complementary bit-line pairs to a precharge current limit value, whereby current flowing into a short between a bit-line and a word-line in a cross-fail is limited to a said precharge current value, wherein said current limiting means comprises a fourth field effect transistor connected between said source of precharge voltage and said second and third field effect transistors, said fourth field effect transistor being biased to limit current flow through said second and third field effect transistors to said precharge current limit value.

2. The low power dynamic random access memory recited in claim 1 wherein said first, second and third field effect transistors are a first conductivity type and said fourth field effect transistor is a second, opposite conductivity type.

3. The low power dynamic random access memory recited in claim 2 wherein said first, second and third field effect transistors are NMOS transistors and said fourth field effect transistor is a PMOS transistor.

4. The low power dynamic random access memory recited in claim 1 wherein said first, second, third, and fourth field effect transistors are the same conductivity type.

5. The low power dynamic random access memory recited in claim 4 wherein said first, second, third, and fourth field effect transistors are NMOS transistors.

6. The low power dynamic random access memory recited in claim 4 wherein said first, second and third field effect transistors are NMOS transistors and said fourth field effect transistor is a depletion NMOS transistor.

7. The low power dynamic random access memory recited in claim 2 wherein said current limiting means comprises at least one said fourth field effect transistor for each pair of said precharge equalization circuits.

8. A low power dynamic random access memory comprising:

a plurality of word-lines and a plurality of complementary bit-line pairs:

a source of precharge voltage for precharging said complementary bit-line pairs:

a plurality of precharge equalization circuits, each of which comprises first, second and third field effect transistors, said first field effect transistor being connected across a corresponding complementary pair of bit-lines and said second and third field effect transistors being connected in series with a respective one of said complementary pair of bit-lines, the gates of each of said first, second and third field effect transistors being connected to receive a precharge equalization control signal;

said plurality of prechange equalization circuits connected to said source of precharge voltage, one precharge equalization circuit for precharging each of said plurality of complementary bit-line pairs; and current limiting means for limiting precharge current flowing into said complementary bit-line pairs to a precharge current limit value, whereby current flowing into a short between a bit-line and a word-line in a cross-fail is limited to a said precharge current value, wherein said current limiting means comprises a resistor connected between said source of precharge voltage and said second and third field effect transistors, said resistor limiting current flow through said second and third field effect transistors to said precharge current limit value.

* * * * *